(12) United States Patent
Magnusson et al.

(10) Patent No.: US 9,429,608 B2
(45) Date of Patent: Aug. 30, 2016

(54) SEPARATION OF CAPACITIVE TOUCH AREAS

(75) Inventors: Gregor Magnusson, Watsonville, CA (US); Peter Reid, Marlborough (GB); Andrew Knowles, Southampton (GB); Jacob Meyberg, Santa Cruz, CA (US); Douglas Rosener, Santa Cruz, CA (US)

(73) Assignee: Plantronics, Inc., Santa Cruz, CA (US)

( * ) Notice: Subject to any disclaimer, the term of this patent is extended or adjusted under 35 U.S.C. 154(b) by 747 days.

(21) Appl. No.: 13/294,398

(22) Filed: Nov. 11, 2011

(65) Prior Publication Data

US 2013/0120005 A1    May 16, 2013

(51) Int. Cl.
| | | |
|---|---|---|
| *G01R 27/26* | (2006.01) | |
| *H01B 13/00* | (2006.01) | |
| *G06F 3/041* | (2006.01) | |
| *G06F 3/00* | (2006.01) | |
| *H03K 17/96* | (2006.01) | |
| *G06F 3/0354* | (2013.01) | |

(52) U.S. Cl.
CPC ............... *G01R 27/26* (2013.01); *G06F 3/00* (2013.01); *G06F 3/03547* (2013.01); *H03K 17/962* (2013.01); *H03K 2017/9602* (2013.01); *H03K 2217/96077* (2013.01); *Y10T 29/49002* (2015.01)

(58) Field of Classification Search
CPC ..... G01R 27/26; Y10T 29/49002; G06F 3/00; G06F 3/03547; H03K 17/962; H03K 2017/9602; H03K 2217/96077
USPC .............. 324/658–690; 345/173, 174; 216/13
See application file for complete search history.

(56) References Cited

U.S. PATENT DOCUMENTS

| | | | |
|---|---|---|---|
| 2008/0174420 A1* | 7/2008 | Hsu et al. ................ | 340/539.11 |
| 2008/0261667 A1* | 10/2008 | Lee et al. ................. | 455/575.7 |
| 2009/0135150 A1* | 5/2009 | Takashima et al. ........ | 345/173 |
| 2009/0225043 A1 | 9/2009 | Rosener | |
| 2010/0182275 A1* | 7/2010 | Saitou ........................ | 345/174 |
| 2010/0200539 A1* | 8/2010 | Yun et al. .................. | 216/13 |
| 2010/0252335 A1* | 10/2010 | Orsley ...................... | 178/18.03 |
| 2010/0311324 A1* | 12/2010 | Rofougaran et al. ........ | 455/39 |
| 2011/0182458 A1* | 7/2011 | Rosener et al. ............. | 381/384 |
| 2011/0230242 A1* | 9/2011 | Maddern et al. ........ | 455/575.8 |
| 2012/0026099 A1* | 2/2012 | Harley .................... | G06F 3/044 |
| | | | 345/173 |
| 2012/0235927 A1* | 9/2012 | Ho et al. ..................... | 345/173 |

FOREIGN PATENT DOCUMENTS

WO    03103175 A1    12/2003

* cited by examiner

*Primary Examiner* — Farhana Hoque
(74) *Attorney, Agent, or Firm* — Richard A. Dunning, Jr.

(57) ABSTRACT

Methods and apparatuses for capacitive sensing are disclosed. In one example, a conductive material is arranged on the mobile device exterior surface outside of a capacitive coupling area undesirably coupling underlying electrodes beneath the surface.

8 Claims, 8 Drawing Sheets

SEPARATION OF CAPACITIVE TOUCH AREAS

CROSS-REFERENCE TO RELATED APPLICATIONS

The present application is related to commonly assigned, copending U.S. patent application Ser. No. 12/695,486, filed. Jan. 28, 2010, entitled "Floating Plate Capacitive Sensor". The full disclosure of this application is incorporated herein by reference.

BACKGROUND OF THE INVENTION

Capacitive touch sensing is used on many products for controls and other applications. Capacitive sensors can be used to detect position or proximity, and are often used in two-dimensional touchpads, touch displays, slide controls, and other types of input interfaces. These input interfaces are commonly utilized by mobile phones, computers, personal digital assistants, and other electronic devices. A device user operates such an electronic device by moving one or more fingers in proximity to or in contact with a sensing region of one or more capacitive sensors at the input interface. One advantage of the use of capacitive touch sensing in electronic devices is that sensing can occur below the device plastic housing without any top level alterations.

Capacitive touch sensors operate by monitoring the change in capacitance above a parasitic capacitance background when a conductor such as the user finger comes in close proximity to or in contact with a sense electrode. Capacitive touch sensing requires each electrode to be physically and electrically separate from the ground of the system and any other nearby conductors or sensor electrodes in order to measure capacitive changes for that particular electrode. Electrically separate in particular means that capacitive coupling is low as this reduces the system sensitivity.

Often a surface finish is put on the plastic for cosmetic purposes. In particular, metallization is sometimes used to give the product a particular look. A conductive material deposited on the device surface may also be used to highlight the location of an underlying sensor or aid in sensing by the underlying sensor. Regardless of the purpose of the conductive material, placing conductive materials over a capacitive touch sensitive area may violate the conductive separation between each underlying sensor "pad" area. Although the surface conductive material is physically separate from the underlying electrodes, it may capacitively couple them together if improperly placed on the device surface. As a result, improved apparatuses and methods for capacitive sensing are needed.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Figure 1A:
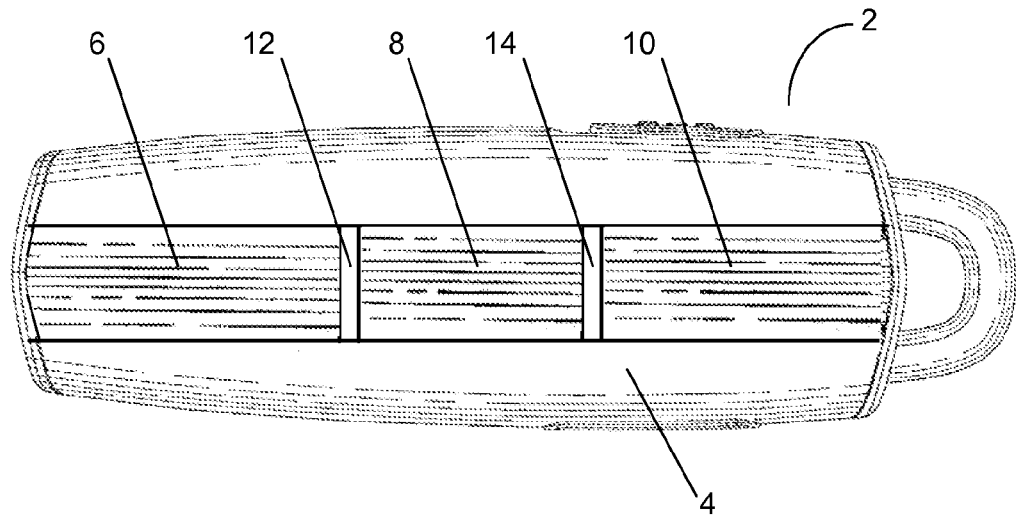
FIG. 1A illustrates a front view of a mobile device in one example having an electrically conductive material disposed on an exterior surface of the mobile device, the electrically conductive material forming a desired pattern comprising several discrete areas.

Methods and apparatuses for capacitive sensing are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

In the event that a decorative or functional coating is conductive within a capacitive touch human interface area, processes are described herein that can be used to make that coating viable. In one example, use of a surface conductive material is made viable for use with underlying capacitive sensors by applying a conductive secondary process and then isolating by mechanically removing conductive material in strategic boundary areas which isolate touch area from the adjacent touch area.

Typical conductive material deposition processes include vacuum metalizing (VM), non-conductive metalizing (NCVM) (which has enough conductivity to be disruptive), metal plating, and painting with materials that contain conductive pigments or "flake". For example, the conductive material may be removed by laser etching or milling.

In a further example, boundary areas are masked that isolate one touch area from another and then applying the conductive material. This can be done through a molded mask, adhesive tape mask, or a photo-chemical mask.

Advantageously, the device with the applied conductive material maintains an overall desired appearance without reducing the functionality of the underlying capacitive sensors. In addition, sensor areas are automatically highlighted. In some cases this is advantageous as it aids the user in knowing where to touch (e.g., user interface input "buttons") or where not to touch (e.g., sensors used to determine whether the device is being worn (donned) or not worn (doffed)).

Furthermore, in certain applications the use of the conductive material on the device surface operates as a floating electrode, enhancing the capacitive touch performance. The apparatuses and methods described herein allow for the use of the higher performing conductive surface. Use of surface conductive materials as floating electrodes is described in previously referenced U.S. patent application Ser. No. 12/695,486, filed Jan. 28, 2010, entitled "Floating Plate Capacitive Sensor".

In one example, a mobile device includes an electrically conductive material disposed on an exterior surface of a mobile device, the electrically conductive material forming a desired pattern including a first discrete conductive area and a second discrete conductive area. A first electrode including a first electrode conductive material is disposed beneath the exterior surface arranged such that the first electrode conductive material and the first conductive area form a first capacitor having a first capacitance. A second electrode including a second electrode conductive material is disposed beneath the exterior surface arranged such that the second electrode conductive material and the second conductive area form a second capacitor having a second capacitance. The mobile device further includes a processor adapted to receive signals from the first electrode to identify when the first conductive area is in contact with or in proximity to a user skin surface and identify when the second conductive area is in contact with or in proximity to a user skin surface.

In one example, a mobile device includes a first electrode including a first electrode conductive material disposed beneath a mobile device exterior surface and a second electrode including a second electrode conductive material disposed beneath the mobile device exterior surface. An exterior conductive material is arranged on the mobile device exterior surface outside of a capacitive coupling area undesirably coupling the first electrode and the second electrode.

In one example, a method for forming an electrically conductive coating on a mobile device exterior includes identifying one or more capacitive touch areas on an exterior surface of a mobile device, the capacitive touch areas associated with capacitive sensors disposed beneath the exterior surface. A conductive material is deposited on the exterior surface. The method further includes selectively removing portions of the conductive material to isolate the one or more capacitive touch areas so that the conductive material is outside of a capacitive coupling area coupling a first capacitive sensor and a second capacitive sensor of the capacitive sensors disposed beneath the exterior surface.

In one example, a method for forming an electrically conductive coating on a mobile device exterior includes identifying a desired capacitive touch area on an exterior surface of a mobile device, the capacitive touch area associated with a select capacitive sensor disposed beneath the exterior surface, wherein the select capacitive sensor is one of among two or more capacitive sensors. A boundary area is masked on the exterior surface adjacent to the desired capacitive touch area. A conductive material is deposited on the exterior surface such that conductive material is formed on an unmasked desired capacitive touch area.

FIG. 1A illustrates a front view of a mobile device 2 in one example having an electrically conductive material disposed on an exterior front surface 4 of the mobile device 2, the electrically conductive material forming a desired pattern comprising several discrete areas. In a further example, the electrically conductive material may form a decorative pattern. In one example, as shown, mobile device 2 is a headset having a housing formed from a plastic material. In one example, the electrically conductive material is a paint including conductive pigments.

In one example, a mobile device 2 includes an electrically conductive material disposed on an exterior front surface 4 of a mobile device 2, the electrically conductive material forming a desired pattern including a discrete conductive area 6, discrete conductive area 8, and discrete conductive area 10. The discrete conductive areas 6, 8, and 10 may be arranged to highlight for a user a desired touch area.

Figure 2:
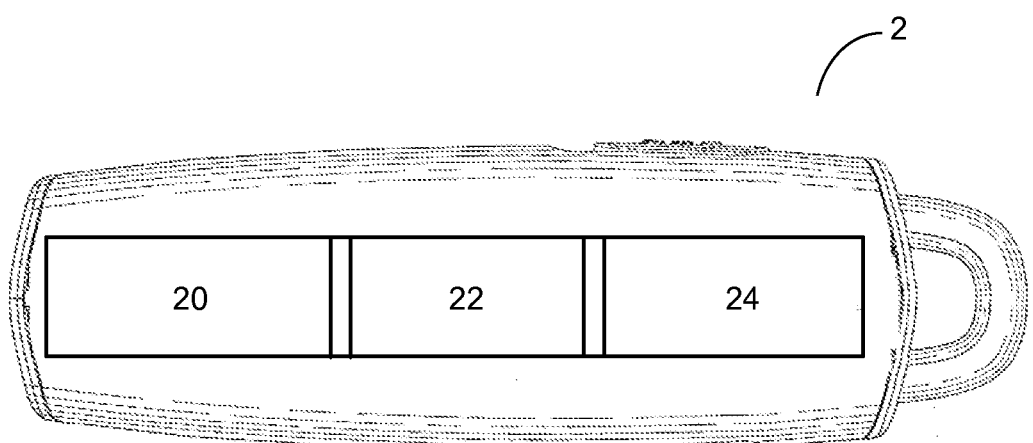
FIG. 2 illustrates the mobile device shown in FIG. 1A with the exterior housing removed, showing several conductive pads associated with capacitive sensors.

FIG. 2 illustrates the mobile device 2 shown in FIG. 1A with the exterior housing having discrete conductive areas 6, 8, and 10 removed, showing several underlying conductive pads associated with capacitive sensors. Referring to FIG. 1A and FIG. 2 together, a first electrode including a first electrode conductive material 20 is disposed beneath the exterior front surface 4 arranged such that the first electrode conductive material 20 and the first discrete conductive area 6 form a first capacitor having a first capacitance. A second electrode including a second electrode conductive material 22 is disposed beneath the exterior front surface 4 arranged such that the second electrode conductive material 22 and the discrete conductive area 8 form a second capacitor having a second capacitance. A third electrode including a third electrode conductive material 24 is disposed beneath the exterior front surface 4 arranged such that the third electrode conductive material 24 and the discrete conductive area 10 form a third capacitor having a third capacitance.

The discrete conductive areas 6, 8, and 10 are separated by non-conductive boundary areas 12 and 14 arranged to prevent capacitive coupling between the underlying electrodes. For example, the discrete conductive areas 6, 8, and 10 and associated underlying electrodes may be operable as user interface inputs.

Discrete conductive areas 6, 8, and 10 are arranged on the mobile device 2 exterior front surface 4 outside of a capacitive coupling area undesirably coupling the first electrode, the second electrode, or third electrode with each other. An undesirable capacitive coupling area would be, for example, an area on the exterior front surface 4 disposed above both the first electrode conductive material 20 and the second electrode conductive material 22. If a conductive material were placed at this location, undesirable capacitive coupling would occur between the first electrode and the second electrode.

The mobile device 2 further includes a processor adapted to receive signals from the electrodes to identify when the discrete conductive area 6 is in contact with or in proximity to a user skin surface, identify when the discrete conductive area 8 is in contact with or in proximity to a user skin surface, and identify when the discrete conductive area 10 is in contact with or in proximity to a user skin surface.

Figure 1B:
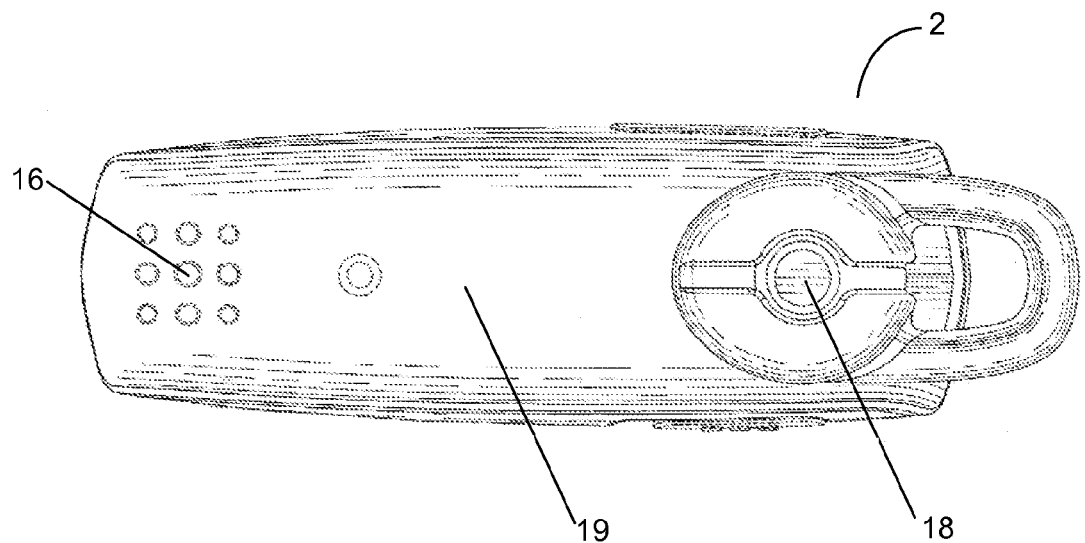
FIG. 1B illustrates a rear view of the mobile device shown in FIG. 1A.

FIG. 1B illustrates a rear view of the mobile device 2. As shown in FIG. 1B, mobile device 2 includes a rear surface 19, apertures 16 leading to a mobile device microphone, and speaker 18 for outputting audio to the user. In one example, one or more discrete conductive areas are disposed on rear surface 19, where the discrete conductive areas are associated with underlying electrodes and arranged in a manner similar to the discrete conductive areas on the front surface 4. For example, together with a discrete conductive area on rear surface 19, an underlying electrode may be configured to determine whether the headset is being worn on the ear of a user by sensing a capacitance associated with contact with a user skin. In one example, where the discrete conductive area on rear surface 19 functions as part of a donned or doffed detector, the discrete conductive area on rear surface 19 highlights for a user an undesirable touch area while the headset is doffed so as to not trigger a false donned indication.

Figure 3:
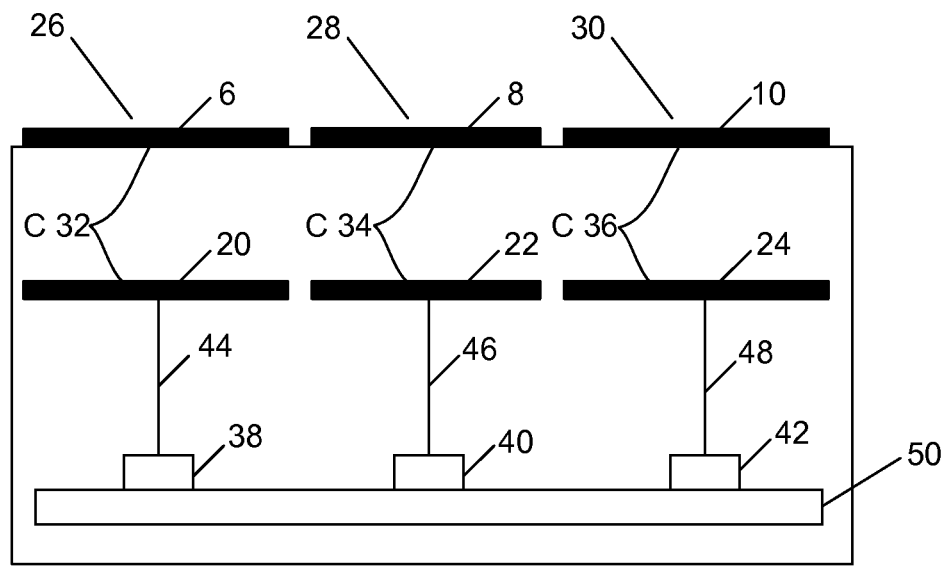
FIG. 3 illustrates a cross sectional view of the mobile device shown in FIG. 1, showing the relationship between the electrically conductive material disposed on the exterior surface of the mobile device and the conductive pads associated with capacitive sensors, where each discrete electrically conductive material and associated underlying conductive pad form a floating electrode capacitive sensor.

FIG. 3 illustrates a side cross sectional view of the mobile device 2 shown in FIG. 1, showing the relationship between the electrically conductive materials disposed on the exterior front surface 4 of the mobile device 2 and the electrode conductive pads associated with capacitive sensors, where each discrete electrically conductive material and associated underlying conductive pad form a floating electrode capacitive sensor.

FIG. 3 illustrates a capacitive sensor 26 having a discrete conductive area 6 operable as a floating sense electrode in one example. The capacitive sensor 26 includes the discrete conductive area 6 disposed on the exterior front surface 4 of the mobile device 2 housing adapted to be brought in proximity to or touch a user skin surface. Capacitive sensor 26 includes a first electrode conductive material 20 operable as a direct coupled interior electrode, the electrode conductive material 20 disposed in proximity to the discrete conductive area 6. The discrete conductive area 6 and electrode conductive material 20 form a capacitor having an internal capacitance C 32.

A capacitive sensor 28 includes a discrete conductive area 8 operable as a floating sense electrode. The capacitive sensor 28 includes the discrete conductive area 8 disposed on the exterior front surface 4 of the mobile device 2 housing adapted to be brought in proximity to or touch a user skin surface. Capacitive sensor 28 includes an electrode conductive material 22 operable as a direct coupled interior electrode, the electrode conductive material 22 disposed in proximity to the discrete conductive area 8. The discrete conductive area 8 and electrode conductive material 22 form a capacitor having an internal capacitance C 34.

A capacitive sensor 30 includes a discrete conductive area 10 operable as a floating sense electrode. The capacitive sensor 30 includes the discrete conductive area 10 disposed on the exterior front surface 4 of the mobile device 2 housing adapted to be brought in proximity to or touch a user skin surface. Capacitive sensor 30 includes an electrode conductive material 24 operable as a direct coupled interior electrode, the electrode conductive material 24 disposed in proximity to the discrete conductive area 10. The discrete conductive area 10 and electrode conductive material 24 form a capacitor having an internal capacitance C 36.

The capacitive sensor 26 further includes a sensor chip 38 direct coupled to the electrode conductive material 20 via a connector 44. For example, connector 44 may be a wire connector. The electrode conductive material 20 is driven by signals from the sensor chip 38. The sensor chip 38 is adapted to determine whether the floating discrete conductive area 6 is in proximity to or touching a user skin surface. The sensor chip 38 is disposed on a printed circuit board (PCB) 50.

Floating discrete conductive area 6 is decoupled from both sensor chip 38 and PCB 50 in that it is not directly coupled using a wire or other means to either sensor chip 38 or PCB 50 and can be described as "floating". Internal capacitance C 32 between the floating sense electrode and the interior electrode may be regarded as extending the touch sense circuit of the sensor chip 38 and coupled electrode conductive material 20 to discrete conductive area 6. The additional internal capacitance C 32 has been inserted into the circuit as a result of the addition of floating discrete conductive area 6. Advantageously, the floating discrete conductive area 6 functions by capacitive coupling to the circuit, and specifically to the direct coupled electrode conductive material 20.

Floating discrete conductive area 6 and coupled electrode conductive material 20 are formed from an electrically conductive material. In one example, the material is copper. The floating discrete conductive area 6 may be formed by plating the electrically conductive material onto the exterior surface of the device housing. Advantageously, there is no need to form a direct electrical connection to the plated electrically conductive material. The plated electrically conductive material need not have a specific form factor, and may take the shape of the housing surface on which it is formed, including a curved surface.

Similarly, the capacitive sensor 28 further includes a sensor chip 40 direct coupled to the electrode conductive material 22 via a connector 46. For example, connector 46 may be a wire connector. The electrode conductive material 22 is driven by signals from the sensor chip 40. The sensor chip 40 is adapted to determine whether the floating discrete conductive area 8 is in proximity to or touching a user skin surface. The sensor chip 40 is disposed on a printed circuit board (PCB) 50.

Floating discrete conductive area 8 is decoupled from both sensor chip 40 and PCB 50 in that it is not directly coupled using a wire or other means to either sensor chip 40 or PCB 50 and can be described as "floating". Internal capacitance C 34 between the floating sense electrode and the interior electrode may be regarded as extending the touch sense circuit of the sensor chip 40 and coupled electrode conductive material 22 to discrete conductive area 8. The additional internal capacitance C 34 has been inserted into the circuit as a result of the addition of floating discrete conductive area 8. Advantageously, the floating discrete conductive area 8 functions by capacitive coupling to the circuit, and specifically to the direct coupled electrode conductive material 22.

Similarly, the capacitive sensor 30 further includes a sensor chip 42 direct coupled to the electrode conductive material 24 via a connector 48. For example, connector 48 may be a wire connector. The electrode conductive material 24 is driven by signals from the sensor chip 42. The sensor chip 42 is adapted to determine whether the floating discrete conductive area 10 is in proximity to or touching a user skin surface. The sensor chip 42 is disposed on a printed circuit board (PCB) 50.

Floating discrete conductive area 10 is decoupled from both sensor chip 42 and PCB 50 in that it is not directly coupled using a wire or other means to either sensor chip 42 or PCB 50 and can be described as "floating". Internal capacitance C 36 between the floating sense electrode and the interior electrode may be regarded as extending the touch sense circuit of the sensor chip 42 and coupled electrode conductive material 24 to discrete conductive area 10. The additional internal capacitance C 36 has been inserted into the circuit as a result of the addition of floating discrete conductive area 10. Advantageously, the floating discrete conductive area 10 functions by capacitive coupling to the circuit, and specifically to the direct coupled electrode conductive material 24.

Figure 4:
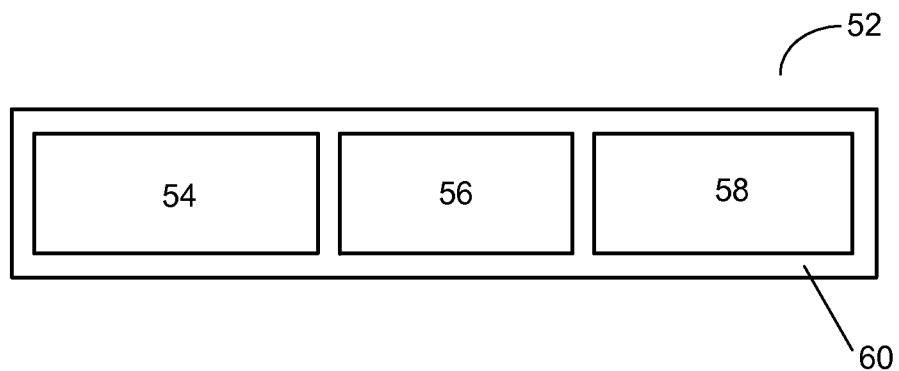
FIG. 4 illustrates a mask utilized in depositing an electrically conductive material on an exterior surface of a mobile device in one example.
Figure 5:
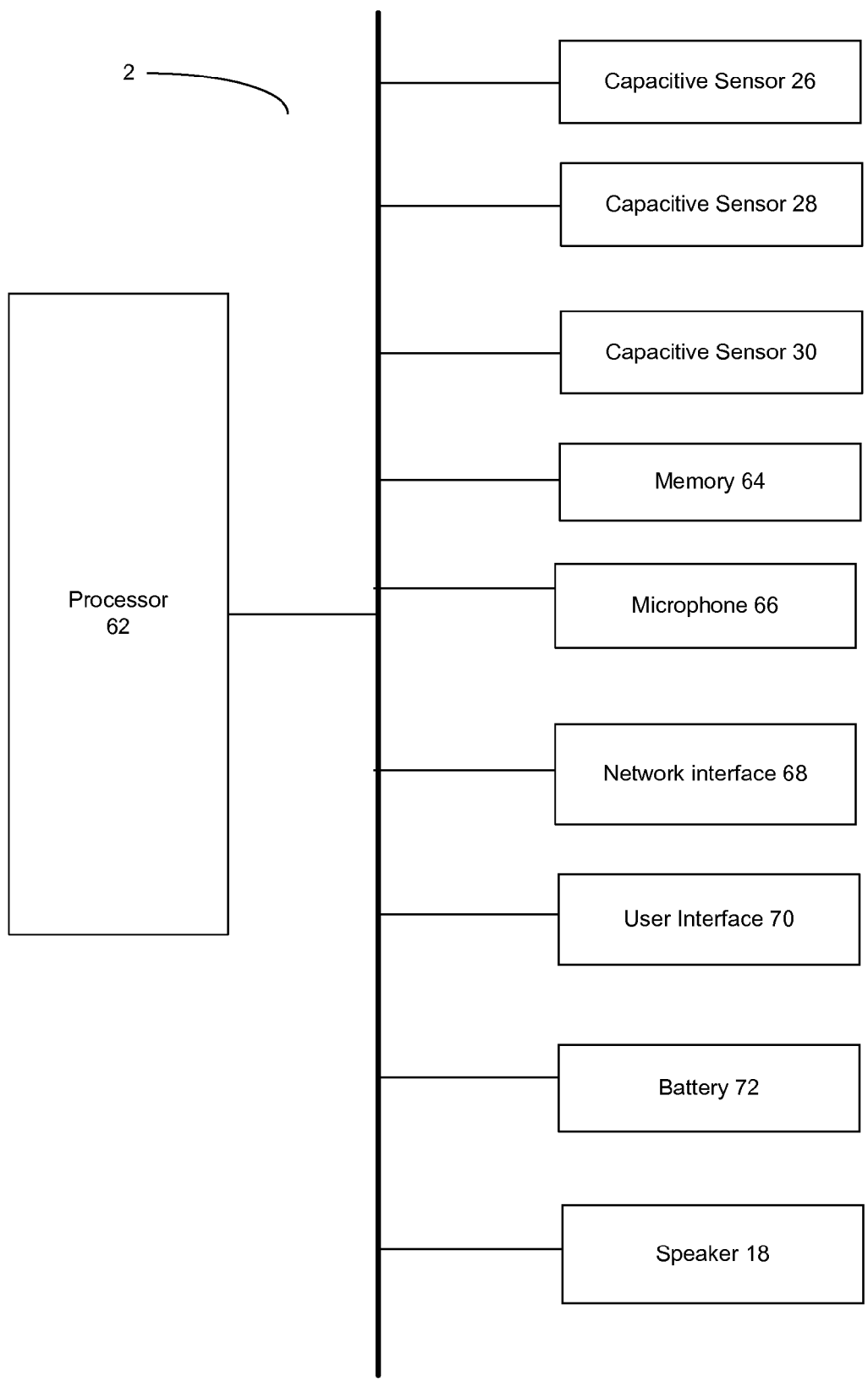
FIG. 5 is a simplified block diagram of the mobile device having exemplary capacitive sensors.

FIG. 4 illustrates a mask 52 utilized in depositing an electrically conductive material on an exterior surface of a mobile device 2 in one example. In the example shown in FIG. 4, mask 52 is configured so that a pattern corresponding to that shown in FIG. 1A can be applied to the exterior surface. As such, in this example mask 52 includes openings 54, 56, and 58 separated by a boundary area 60. When mask 52 is placed over the desired location of the mobile device 2 housing, openings 54, 56, and 58 correspond to areas on which the conductive material will be applied, where the conductive material will be separated into three discrete areas as a result of masking of the surface due to boundary area 60. For example, conductive material is deposited on openings 54, 56, and 58 to form discrete conductive areas 6, 8, and 10, respectively, on the mobile device exterior surface. One of ordinary skill will recognize that the configuration of mask 52 will vary greatly depending on the desired pattern of the conductive material to be applied to the mobile device exterior surface FIG. 5 is a simplified block diagram of the mobile device 2 having exemplary capacitive sensors. Referring to FIG. 5, a simplified block diagram of a mobile device 2 utilizing the capacitive sensor 26, capacitive sensor 28, and capacitive sensor 30 shown in FIG. 3 is illustrated. Mobile device 2 includes a processor 62 operably coupled to a capacitive sensor 26, capacitive sensor 28, capacitive sensor 30, a memory 64, a microphone 66, a network interface 68, user interface 70, battery 72, and a speaker 18. In one example implementation, certain components of capacitive sensors 26, 28, and 30 shown in FIG. 3 may be integrated with components at mobile device 2. For example, sensor chips 38, 40, or 42 and PCB 50 may be integrated with processor 62 and a mobile device PCB, respectively.

Processor 62 controls the operation of the mobile device 2 and allows for processing data, and in particular managing data between capacitive sensors 26, 28, and 30 and memory 64 for determining the touch state of the capacitive sensors. In one example, processor 62 is a high performance, highly integrated, and highly flexible system-on-chip (SOC). Processor 62 may include a variety of separate or integrated processors (e.g., digital signal processors), with conventional CPUs being applicable, and controls the operation of the mobile device 2 by executing programs in memory 64.

Memory 64 may include a variety of memories, and in one example includes SDRAM, ROM, flash memory, or a combination thereof. Memory 64 may further include separate memory structures or a single integrated memory structure. In one example, memory 64 may be used to store passwords, network and telecommunications programs, and/ or an operating system (OS). In one embodiment, memory 64 stores a donned and doffed determination application which processes data from capacitive sensor 26 to identify a device donned state or doffed state. Memory 64 may also store signals or data from capacitive sensors 26, 28, and 30.

In one example, network interface 68 includes a transceiver for communicating with a wireless local area network (LAN) radio transceiver (e.g., wireless fidelity (WiFi), Bluetooth, ultra wideband (UWB) radio, etc.) for access to a network, or an adaptor for providing wired communications to a network. The network interface 68 may communicate using any of various protocols known in the art for wireless or wired connectivity.

User interface 70 allows for communication between a headset user and the mobile device 2, and in one example includes an audio and/or visual interface such that a prompt may be provided to the user's ear and/or an LED may be lit. For example, an audio interface may be initiated by the headset upon detection that the headset is donned. In addition, the audio interface can provide feedback to the user in the form of an audio prompt (e.g., a tone or voice) through the speaker 18 indicating the mobile device 2 is in place (i.e., "donned"). User interface 70 includes user input and output functionality in addition to that described herein with respect to capacitive sensors 26, 28, and 30.

Figure 6:
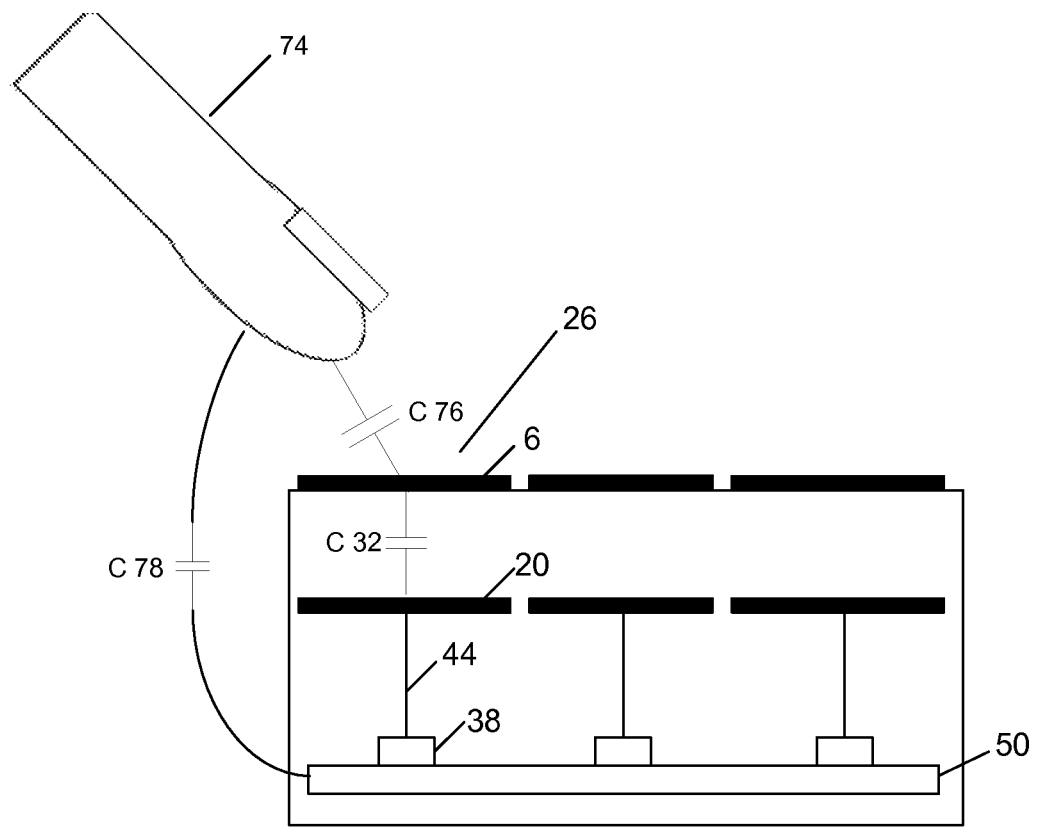
FIG. 6 illustrates a floating electrode capacitive sensor in operation in one example.

FIG. 6 illustrates a floating electrode capacitive sensor 26 in operation in one example. Although operation of capacitive sensor 26 will be described, operation of capacitive sensor 28 and sensor chip 38 is substantially similar.

In the example shown in FIG. 6, the capacitive sensor 26 is implemented as part of a user interface, such as a touch pad, whereby a user finger 74 brought in proximity to or in contact with the capacitive sensor 26 to indicate a user interface input action. Although a user finger 74 is described in this example, skin at any user part may be utilized.

When the user finger 74 is brought in proximity to or in contact with the floating discrete conductive area 6, a sense capacitance C 76 is formed between the user skin surface and the floating discrete conductive area 6, A PCB capacitance C 78 is formed between the user skin surface and PCB 12. The user skin surface is a conductor, and where the user finger 74 is brought in proximity to the floating discrete conductive area 6 but not in contact with, the air gap there between results in a sense capacitance C 76 which increases as the user finger 74 is brought closer to the floating discrete conductive area 6 and the air gap decreases. As described previously in reference to FIG. 1A, the coupled electrode conductive material 20 and floating discrete conductive area 6 form a capacitor having an internal capacitance C 32.

The capacitance C 76 between the user finger and the floating discrete conductive area 6, the capacitance C 32 between the floating discrete conductive area 6 and the interior electrode conductive material 20, and the PCB capacitance C 78 between the user finger and the PCB 50 are all in series. In a simplified model where parasitic capacitance has been calibrated for, the total measured capacitance $C_T$ can be written as:

$$1/C_T = 1/C_{76} + 1/C_{32} + 1/C_{78}$$

In the above formula, C 78 is typically very large relative to C 32 and can be discarded, so the equation can be simplified to:

$$1/C_T = 1/C_{76} + 1/C_{32}$$

In operation, the significant measurable change in capacitance is between the user finger 74 and the floating electrode discrete conductive area 6. Three states of operation may be utilized:

(1) The user finger 74 is very far from the floating electrode

When the user finger 74 is far from the floating electrode, C 76 approximates zero, and thus $1/C_{76}$ is very large, resulting in $C_T=0$. In this state, the sensor chip 38 will measure the parasitic capacitance in the circuit or measure approximately zero if the parasitic capacitance has been calibrated for.

(2) The user finger 74 is in close proximity to the floating electrode, but not in direct contact When the user skin surface is brought in proximity to the floating discrete conductive area 6, the sensor chip 38 measures a capacitance dependent upon the series combination of sense capacitance C 76 and the internal capacitance C 32. The sense capacitance C 76 and internal capacitance C 32 dominate, and will be measured by the sensor chip 38: $1/C_T = 1/C_{76} + 1/C_{32}$ (3) The user finger 74 directly contacts the floating discrete conductive area 6

When the user finger 74 is in direct contact with the floating discrete conductive area 6, the sensor chip 38 measures a capacitance approximately equal to the internal capacitance C 32. When the user finger 74 contacts the floating discrete conductive area 6, C 76 become very large, and thus $1/C_{76}$ approaches zero, resulting in: $C_T=C$ 32. The sensor chip 38 thus reads the internal capacitance C 32 between the floating discrete conductive area 6 and the coupled electrode conductive material 20. Advantageously, the capacitance measurement is the same each time the user contacts the floating discrete conductive area 6 since it is not dependent on a body-PCB capacitance measurement as in the prior art.

Figure 7A:
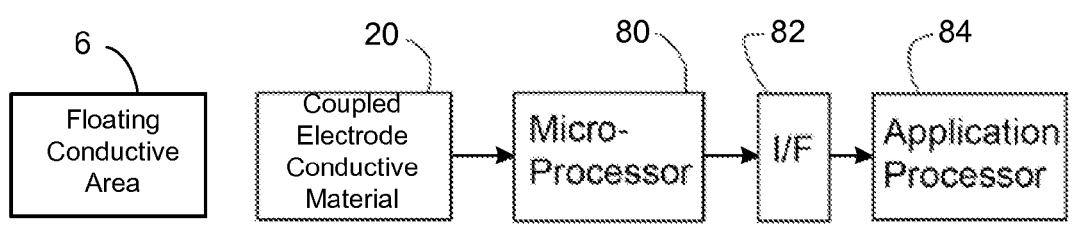
FIG. 7A is a block diagram illustrating an architecture of the system for capacitive touch sensing.
Figure 7B:
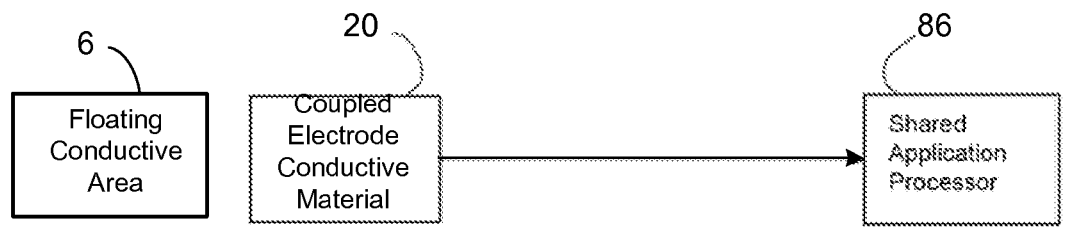
FIG. 7B illustrates an alternative architecture of the system for capacitive touch sensing.

FIG. 7A is a block diagram illustrating an architecture of the system for capacitive touch sensing. FIG. 7B illustrates an alternative architecture of the system for capacitive touch sensing. Although operation of capacitive sensor 26 will be described, operation of capacitive sensor 28 and sensor chip 38 is substantially similar.

In FIG. 7A there is a block diagram illustrating an architecture of a system for capacitive touch sensing. The system includes the floating discrete conductive area 6, the coupled electrode conductive material 20, and a microprocessor 80 to receive signals from the coupled electrode conductive material 20 which includes interface firmware and touch sensing firmware to acquire and analyze the measured capacitance of the floating discrete conductive area 6. The system also includes an interface 82 which can be in the form of hardware or software and an application processor 84.

FIG. 7B illustrates an alternative architecture of the system for capacitive touch sensing which is included as part of a system providing other functions of a computer. In the architecture shown in FIG. 7B, system signals from the floating discrete conductive area 6 are transmitted via coupled electrode conductive material 20 to a shared application processor 86 which includes application firmware and touch sensing firmware to perform the necessary calculations. In one example, the shared application processor 86 is adapted to receive signals from the coupled electrode conductive material 20 to determine measured capacitance associated with a capacitance at floating discrete conductive area 6 and the capacitance at coupled interior electrode conductive material 20 indicating a touch state. The measured capacitance is approximately the capacitance between the floating discrete conductive area 6 and the coupled electrode conductive material 20 when the mobile device is in a touched state.

In a further example, a mobile device 2 may have an electrically conductive material disposed on an exterior surface of the mobile device 2 where the electrically conductive material is purely decorative. For example, the exterior electrically conductive material is arranged so that the first electrode and the second electrode function independent of the exterior electrically conductive material. The exterior conductive material is arranged on the mobile device exterior surface outside of a capacitive coupling area undesirably coupling the first electrode and the second electrode, where the capacitive coupling area is an area disposed above both the first electrode conductive material and the second electrode conductive material.

Figure 8:
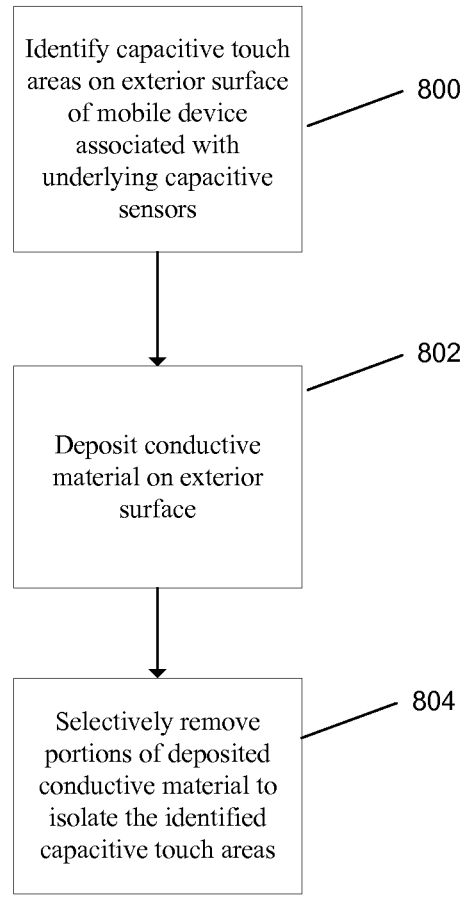
FIG. 8 is a flow diagram illustrating a process for forming an electrically conductive coating on a mobile device exterior in one example.

FIG. 8 is a flow diagram illustrating a process for forming an electrically conductive coating on a mobile device exterior in one example. At block 800, one or more capacitive touch areas on an exterior surface of a mobile device are identified, the capacitive touch areas associated with capacitive sensors disposed beneath the exterior surface.

At block 802, a conductive material is deposited on the exterior surface. In one example, depositing a conductive material on the exterior surface comprises utilizing a vapor metallization or metal plating process.

At block 804, portions of the conductive material are selectively removed to isolate the one or more capacitive touch areas so that the conductive material is outside of a capacitive coupling area coupling a first capacitive sensor and a second capacitive sensor of the capacitive sensors disposed beneath the exterior surface. In one example, selectively removing portions of the conductive material comprises utilizing a mechanical removal process. For example, the mechanical removal process may utilize laser etching or milling.

Figure 9:
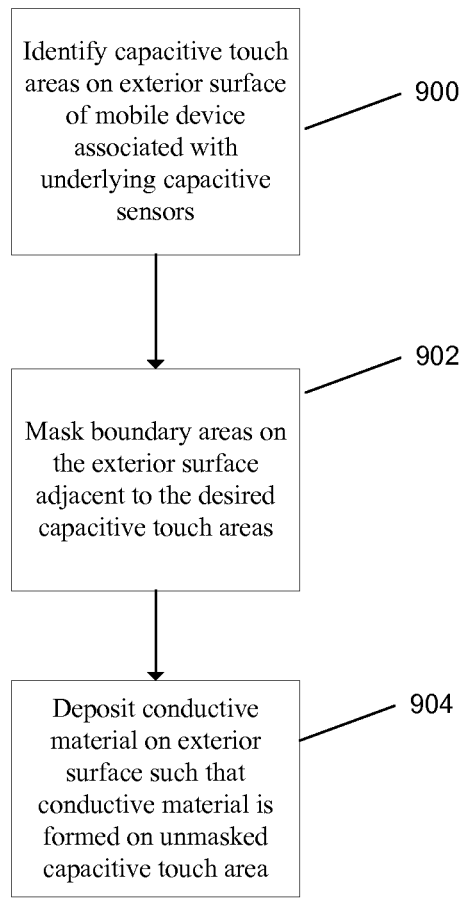
FIG. 9 is a flow diagram illustrating a process for forming an electrically conductive coating on a mobile device exterior in a further example.

FIG. 9 is a flow diagram illustrating a process for forming an electrically conductive coating on a mobile device exterior in a further example. At block 900, a desired capacitive touch area is identified on an exterior surface of a mobile device, the capacitive touch area associated with a select capacitive sensor disposed beneath the exterior surface, where the select capacitive sensor is one of among two or more capacitive sensors. In one example, the desired capacitive touch area is disposed above a select capacitive sensor electrode.

At block 902, a boundary area is masked on the exterior surface adjacent to the desired capacitive touch area. In one example, the boundary area is arranged to prevent undesirable capacitive coupling between the desired capacitive touch area and an unassociated capacitive sensor disposed beneath the exterior surface when a user finger is brought in proximity or in contact with the desired capacitive touch area. In one example, masking one or more boundary areas comprises using a photochemical masking process. In a further example, masking one or more boundary areas comprises using a molded mask or an adhesive tape mask. At block 904, a conductive material is deposited on the exterior surface such that conductive material is formed on the unmasked desired capacitive touch area.

While the exemplary embodiments of the present invention are described and illustrated herein, it will be appreciated that they are merely illustrative and that modifications can be made to these embodiments without departing from the spirit and scope of the invention. For example, the capacitive sensor described herein may be embodied in other mobile devices in addition to headsets. Although certain examples describe simplified models of operation, in further examples other models and manners of operation may be employed. Thus, the scope of the invention is intended to be defined only in terms of the following claims as may be amended, with each claim being expressly incorporated into this Description of Specific Embodiments as an embodiment of the invention.

What is claimed is:

1. A method for forming capacitive sensors for a mobile device comprising:

identifying first and second capacitive touch areas on an exterior surface of the mobile device, wherein the first and second capacitive touch areas are associated with first and second electrodes, respectively and wherein the first and second electrodes are disposed beneath the exterior surface;

depositing a conductive material on the exterior surface; and selectively removing portions of the conductive material to form first and second floating electrodes in the first and second capacitive touch areas, respectively, wherein the first floating electrode and the first electrode form a first one of the capacitive sensors, wherein the second floating electrode and the second electrode form a second one of the capacitive sensors, and wherein the conductive material is outside of a capacitive coupling area coupling the first and second ones of the capacitive sensors.

2. The method of claim 1, wherein depositing the conductive material on the exterior surface comprises utilizing a vapor metallization or metal plating process.

3. The method of claim 1, wherein selectively removing portions of the conductive material comprises utilizing a mechanical removal process.

4. The method of claim 3, wherein the mechanical removal process comprises laser etching or milling.

5. A method for forming a capacitive sensor for a mobile device comprising:
   identifying a desired capacitive touch area on an exterior surface of the mobile device, the desired capacitive touch area associated with a select electrode disposed beneath the exterior surface, wherein the select electrode is one of among two or more electrodes;
   masking a boundary area on the exterior surface adjacent to the desired capacitive touch area, wherein the boundary area is arranged to prevent capacitive coupling between the desired capacitive touch area and an unassociated electrode disposed beneath the exterior surface; and
   depositing a conductive material on the exterior surface such that the conductive material forms a floating electrode on an unmasked desired capacitive touch area, wherein the select electrode and the floating electrode formed on the unmasked desired capacitive touch area form the capacitive sensor.

6. The method of claim 5, wherein the desired capacitive touch area is disposed above a select capacitive sensor electrode.

7. The method of claim 5, wherein masking one or more boundary areas comprises using a photochemical masking process.

8. The method of claim 5, wherein masking one or more boundary areas comprises using a molded mask or an adhesive tape mask.

* * * * *